(12) United States Patent
Walker

(10) Patent No.: US 6,523,968 B1
(45) Date of Patent: Feb. 25, 2003

(54) DECORATIVE FABRIC

(75) Inventor: Michael S. Walker, Forest City, NC (US)

(73) Assignee: The Manual Woodworkers and Weavers, Inc., Hendersonville, NC (US)

(*) Notice: Subject to any disclaimer, the term of this patent is extended or adjusted under 35 U.S.C. 154(b) by 0 days.

(21) Appl. No.: 09/426,825

(22) Filed: Oct. 25, 1999

(51) Int. Cl.[7] .............................................. F21V 33/00
(52) U.S. Cl. ....................... 362/103; 362/806; 362/249; 28/163; 139/383 R
(58) Field of Search ................................ 362/103, 108, 362/249, 252, 184, 806; 2/905; 139/1 R, DIG. 1, 11, 383 R; 28/163

(56) References Cited

U.S. PATENT DOCUMENTS

| | | |
|---|---|---|
| 1,216,929 A | 2/1917 | Weitzman |
| 3,549,878 A | 12/1970 | Bailey |
| 4,164,008 A | 8/1979 | Miller et al. |
| 4,234,907 A | 11/1980 | Daniel |
| 4,308,572 A | 12/1981 | Davidson et al. |
| 4,480,293 A | 10/1984 | Wells |
| 4,570,206 A | 2/1986 | Deutsch |
| 4,602,191 A | 7/1986 | Davila |
| 4,709,307 A | 11/1987 | Branom |
| 4,727,603 A | 3/1988 | Howard |
| 4,875,144 A * | 10/1989 | Wainwright ................. 362/103 |
| 5,085,252 A | 2/1992 | Mohamed et al. |
| 5,113,325 A * | 5/1992 | Eisenbraun .................. 362/103 |
| 5,224,519 A * | 7/1993 | Farley .......................... 139/11 |
| 5,366,780 A * | 11/1994 | Rapisarda .................... 362/249 |
| 5,465,760 A | 11/1995 | Mohamed et al. |
| 5,519,595 A * | 5/1996 | Wang .......................... 362/234 |
| 5,575,098 A | 11/1996 | Goettel-Schwartz |
| 5,983,952 A * | 11/1999 | Carpenter et al. .......... 139/1 R |
| 6,105,624 A * | 8/2000 | Wildeman et al. ...... 139/383 R |

* cited by examiner

Primary Examiner—Thomas M. Sember
(74) Attorney, Agent, or Firm—Nelson Mullins Riley & Scarborough, LLP (57) ABSTRACT

A decorative fabric for use in home furnishings includes a woven web having a back side and having a front side. The front side defines an ornamental design. The web defines a plurality of loose weave areas formed by non-interlocking warp yarns and filling yarns located at predetermined positions within the design. The non-interlocking warp yarns and filling yarns in each area are separable from each other to form an orifice through the web. Each of a plurality of ornamental devices is inserted through a respective orifice and protrudes through the front side of the web.

21 Claims, 8 Drawing Sheets

DECORATIVE FABRIC

BACKGROUND OF THE INVENTION

The present invention relates generally to decorative fabrics used in home furnishings, for example tapestries, decorative pillows, tree skirts, stockings, wall hangings, bell pulls, afghans and similar home decor textile products. Such fabrics are often woven or quilted with intricate decorative patterns. More particularly, the present invention relates to a decorative fabric in which orifices are woven into the fabric that are suitable for insertion of three-dimensional ornamental devices.

Ornamental devices, for example light emitting diodes, have been used to decorate fabrics, such as apparel products. Typically, the LEDs or light bulbs are secured in the garment by grommets or similar eyelets bounding holes that are generally formed by cutting or otherwise puncturing the fabric. A power source such as a switched battery may be attached to the garment to energize the LEDs.

SUMMARY OF THE INVENTION

The present invention recognizes and addresses the foregoing considerations, and others, of prior art constructions and methods.

Accordingly, it is an object of the present invention to provide an improved decorative fabric for use in home furnishings that allows insertion of three-dimensional ornamental devices. Additional objects and advantages of the invention will be set forth in part in the following description, or may be obvious from the description, or may be learned through practice of the invention.

Such objects are achieved by a decorative woven fabric for use in home furnishings. The fabric includes a woven web having a front side and a back side, wherein the front side defines an ornamental design. The web defines a plurality of loose weave areas that are formed by non-interlocking warp yarns and filling yarns and that are located at predetermined positions within the design. The non-interlocking warp and filling yarns in each loose weave area are separable from each other to form an orifice through the web. A plurality of ornamental devices are inserted through respective orifices and protrude through the front side of the web.

In accordance with the present invention, a process for forming a decorative woven fabric for use in home furnishings is also provided. The process includes providing an ornamental fabric design and weaving a web according to the design. The weaving step includes holding a defined number of warp yarns at each of a plurality of predetermined positions in the design in an open shed position for a defined number of picks. The number of warp yarns and the number of picks define a loose weave area of separable non-interlocking warp yarns and filling yarns. Ornamental devices are inserted through respective loose weave areas.

The accompanying drawings, which are incorporated in and constitute a part of this specification, illustrate one or more embodiments of the present invention and, together with the description, serve to explain the principles of the invention.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. It will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

In general, the present invention is directed to a decorative woven fabric that contains loose weave areas and to a process for making such a fabric. "Loose weave areas" as used herein refers to areas of a woven web in which the warp and filling yarns are non-interlocking. The loose weave allows the warp and filling yarns to separate from each other, forming orifices through which three-dimensional ornamental devices may be placed.

The embodiment illustrated in the present figures is directed to a wall hanging or tapestry with light emitting devices placed through the front of the fabric. It should be understood, however, that this example is provided for illustrative purposes only and that fabrics according to the present invention may be used in a variety of home decorations, for example stockings, wall hangings, bell pulls and afghans.

The decorative fabric of the present invention is made from woven warp and filling yarns. These yarns may be multifilament, filament, or spun yarns that are single or multi-ply. The yarn fibers may be formed from synthetic materials such as polyester, rayon or acrylic, natural materials such as wool or cotton, or a mixture of both.

Furthermore, the linear density of these yarns may vary. In one particular embodiment, single ply multifilament polyester yarns are used in the warp, while single ply spun cotton yarns and single ply spun acrylic yarns are used as filling yarns.

The utilization of woven-in loose weave areas eliminates a post-weave step required if the orifices are cut into a full-woven fabric. Furthermore, because the yarns are not cut, the warp and filling yarn integrity is maintained after insertion of ornamental devices.

Figure 2A:
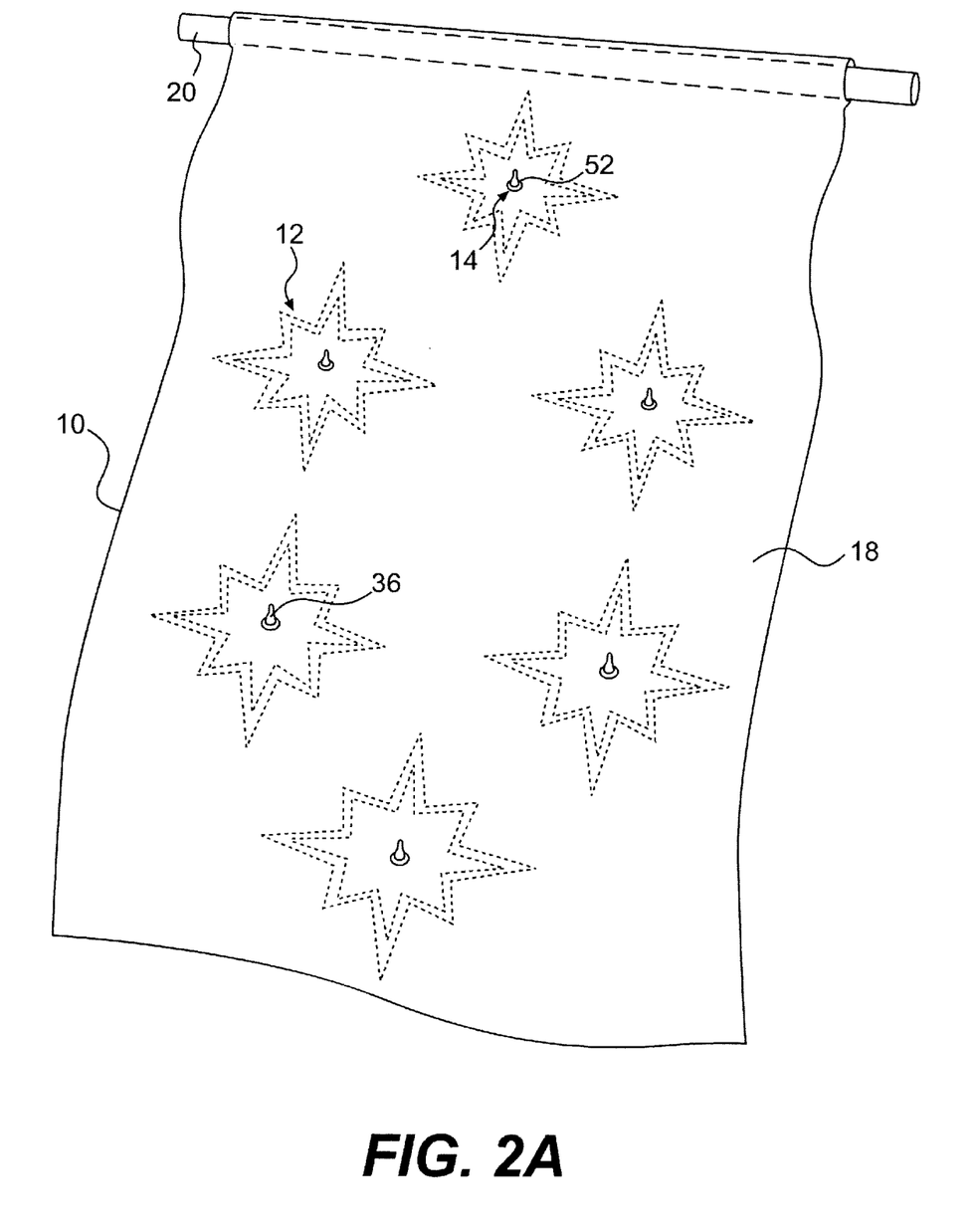
FIG. 2A is a perspective view of the front side of the finished fabric in accordance with an embodiment of the present invention.
Figure 2B:
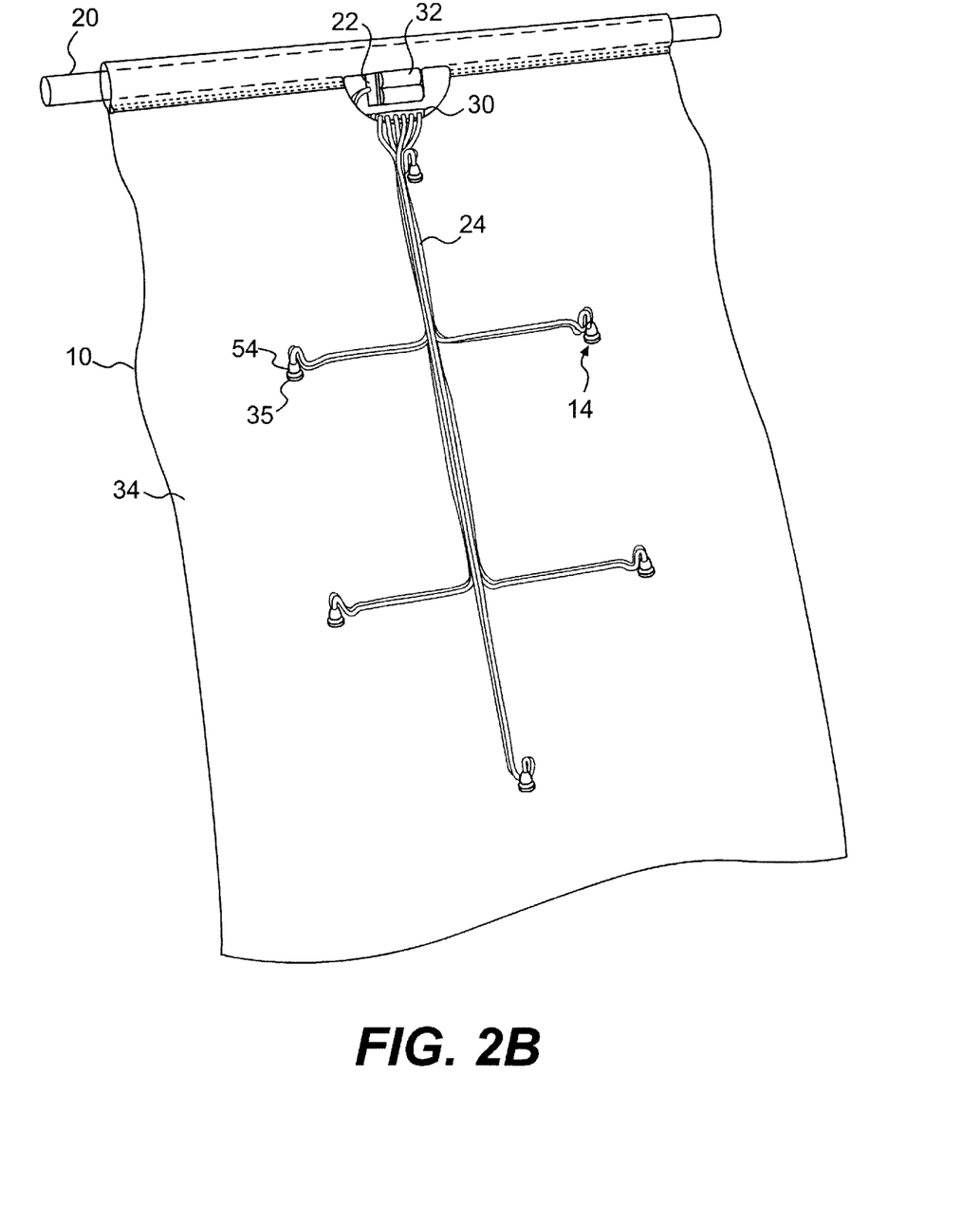
FIG. 2B is a perspective view of the back side of the finished fabric shown in FIG. 2A.
Figure 2C:
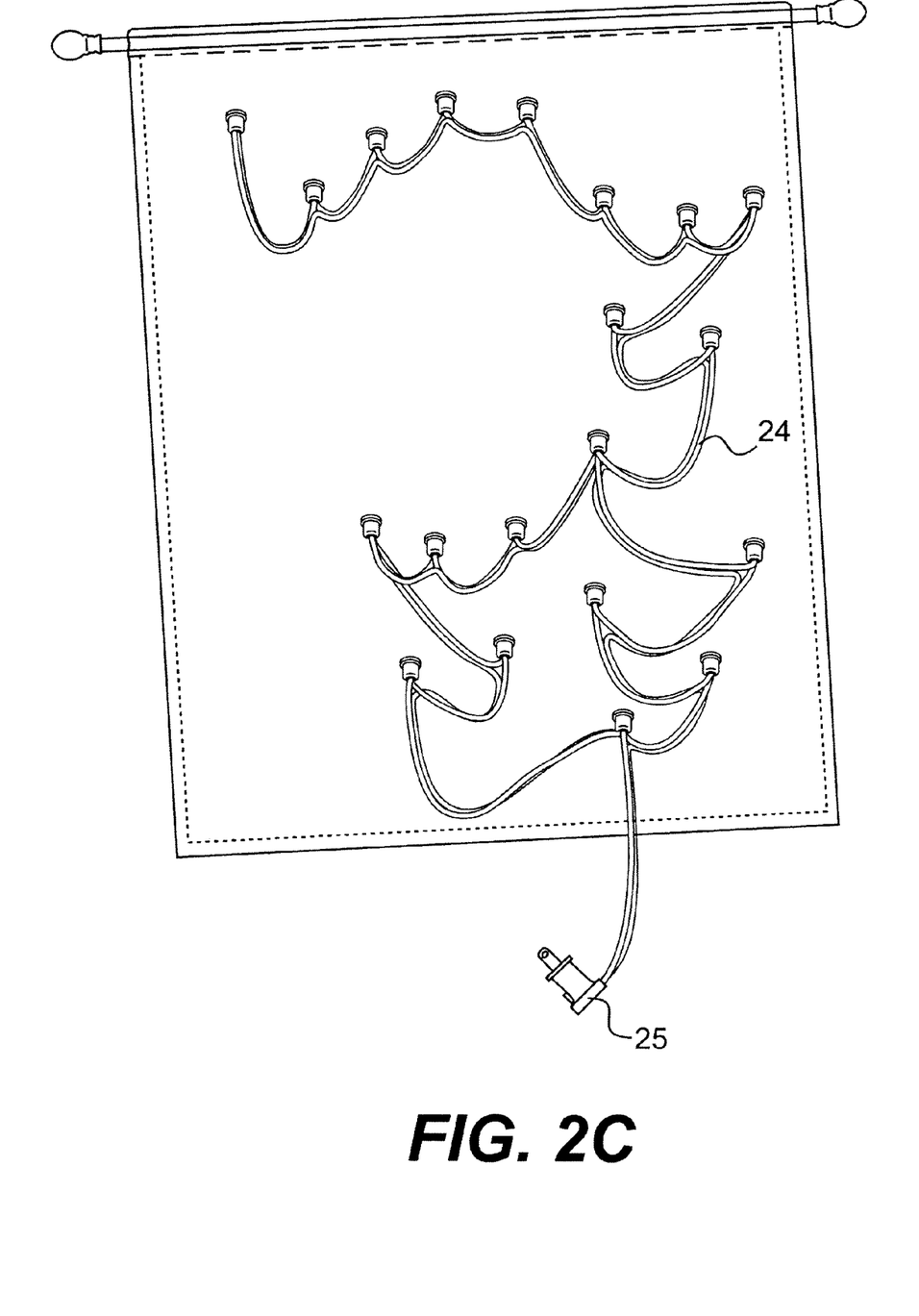
FIG. 2C is a perspective view of a back side of a finished fabric in accordance with an embodiment of the present invention.

Referring now to FIGS. 2A and 2B, a tapestry 10 includes a woven web having a front side 18, a back side 34 and a design 12 printed on or woven into the web. The web defines a plurality of loose weave areas, indicated at 14, at predetermined positions in the design at which it is desired to secure an ornamental device. Each loose weave area is formed by warp yarns and filling yarns that may be separated to form an orifice through which the device, such as a light bulb 36, is inserted.

Where the ornamental devices require a power source, a holding mechanism, for example a bracket 22, may be attached to the fabric to secure the power source. A plurality of wires 24 deliver electric current to each light bulb 36 from a junction 30 connected to the power source, for example batteries 32. In another preferred embodiment shown in FIG. 2C, wires 24 lead to a plug 25 that may be received by an AC wall receptacle to power the bulbs. FIGS. 2B and 2C also illustrate that the wires may be bound directly to the web or may extend between the light bulbs otherwise unattached to the web.

Figure 3:
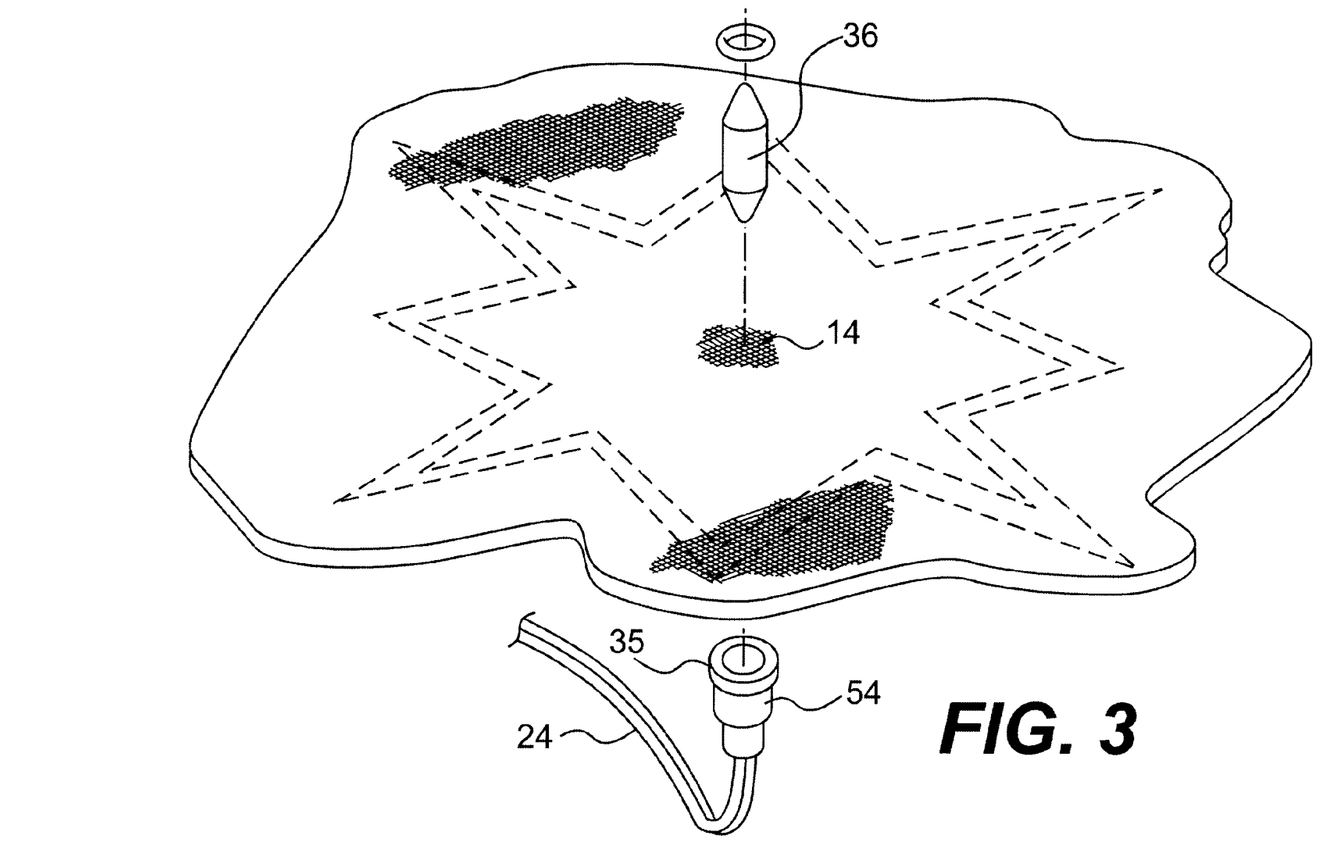
FIG. 3 is a partial exploded view of a finished fabric in accordance with an embodiment of the present invention.

Referring also to FIG. 3, each wire 24 may be connected to a receptacle 54 in which a light bulb 36 is attached. Each light bulb 36 is pushed through a corresponding loose weave area 14, forming an orifice in the web into which the light bulb securely fits. An enlarged edge 35 of receptacle 54 abuts the back of the web to prevent the receptacle from passing through the orifice. An O-ring 52 can be placed over the top of the protruding light bulb so as to abut the front of the web and thereby hold the bulb in place. A mounting rod 20 may be included to permit hanging of tapestry 10.

Figure 4A:
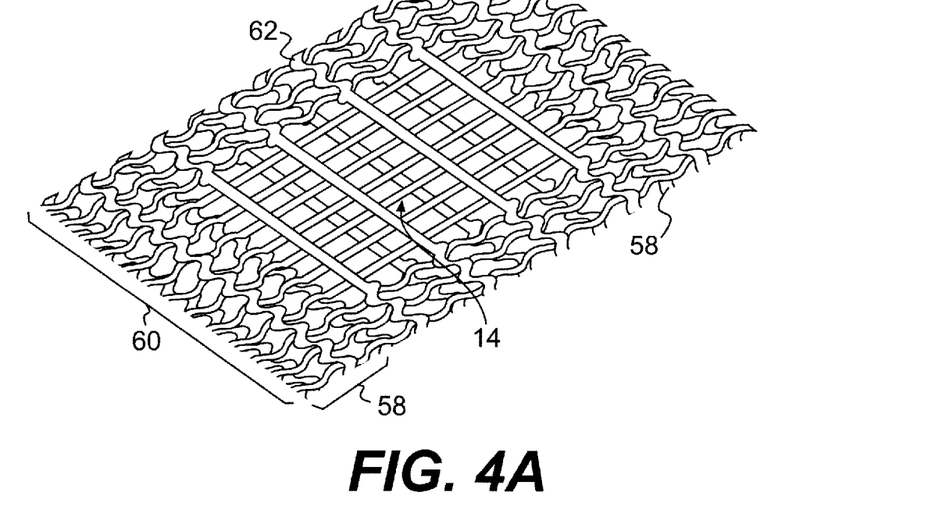
FIG. 4A is an enlarged partial view of a loose weave area within a decorative fabric in accordance with an embodiment of the present invention.
Figure 4B:
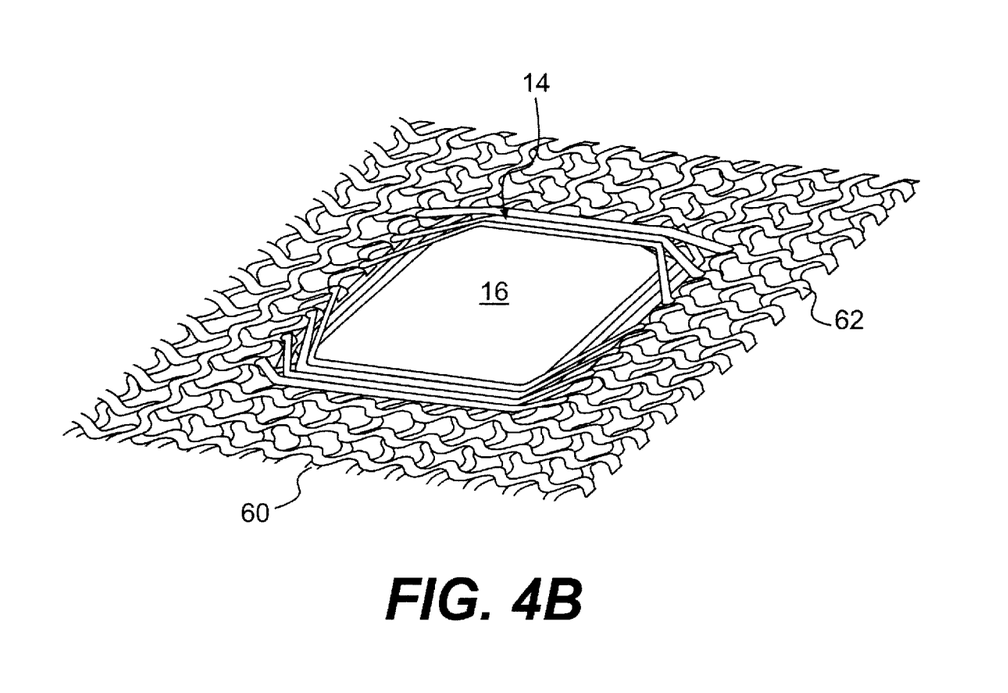
FIG. 4B is an enlarged partial view of a loose weave area within a decorative fabric in accordance with an embodiment of the present invention.

FIGS. 4A and 4B illustrate the construction of the loose weave areas before and after the orifice is formed. As shown in FIG. 4A, a first group of filling yarns 58 interlock with warp yarns 62 in a tight weave entirely across either side of loose weave area 14. A second group of filling yarns 60 interlock with warp yarns 62 in a tight weave before and after loose weave area 14 but overlap the warp yarns (i.e. they do not interlock) within the area. Warp yarns 62 may lie on top of filling yarns 60 within area 14, or filling yarns 60 may lie on top of warp yarns 62. These arrangements may be combined, so that in a single loose weave area some warp yarns 62 are above, while others are below, the filling yarns. Furthermore, the relationship of the warp yarns to the filling yarns may change from one loose weave area to the next.

An ornamental device pushed through a loose weave area creates an orifice 16, as shown in FIG. 4B. For clarity of illustration, FIG. 4B omits the ornamental device. Because filling yarns 60 and warp yarns 62 in the loose weave area are not broken or cut, insertion of the ornamental device does not weaken the fabric's tensile strength as if the fabric were punctured.

The number of filling yarns (picks) and the number of warp yarns (ends) within the loose weave area are a function of the size of the yarns being used and the size of the ornamental devices being inserted through the loose weave. In a preferred embodiment, the loose weave area should be of a size to ensure that the ornamental device fits securely through the loose weave area without additional attachment. For instance, the loose weave areas may be sized to accommodate light bulbs commonly used to decorate Christmas trees. Where the yarn size is about 4/1 count in the filling direction and about 150 denier in the warp direction, and where the light bulb's diameter is about 0.2 inches, the loose weave area may be approximately 18 picks and 36 ends. The bulb's length in one embodiment is approximately 0.33 inches. It should be understood by those skilled in this art, however, that these dimensions are provided by way of explanation only and that any suitable loose weave area formation appropriate for a given fabric and ornamental device falls within the scope and spirit of the present invention. For example, the loose weave areas may preferably range in size from 6 to 60 picks and from 6 to 60 ends. Moreover, it should be understood that a variety of ornamental devices, lighted or non-lighted, may be used.

One preferred embodiment of a method for forming a loose weave area within a decorative fabric in accordance with the present invention will now be described with reference to FIGS. 1, 5, 6A and 6B. The fabric may include any ornamental design and may be woven in any suitable manner, for example on a dobby loom or on a Jacquard loom as partially illustrated in FIG. 1. As should be well understood in this art, a fabric design in a Jacquard system is loaded into a computer (not shown) that controls the head 40 of the Jacquard loom in a conventional manner. Jacquard head 40 controls heddle wires 38. Heddle wires 38, in turn, control the vertical position of heddle eyes 42, through which pass warp yarns 62.

Figure 1:
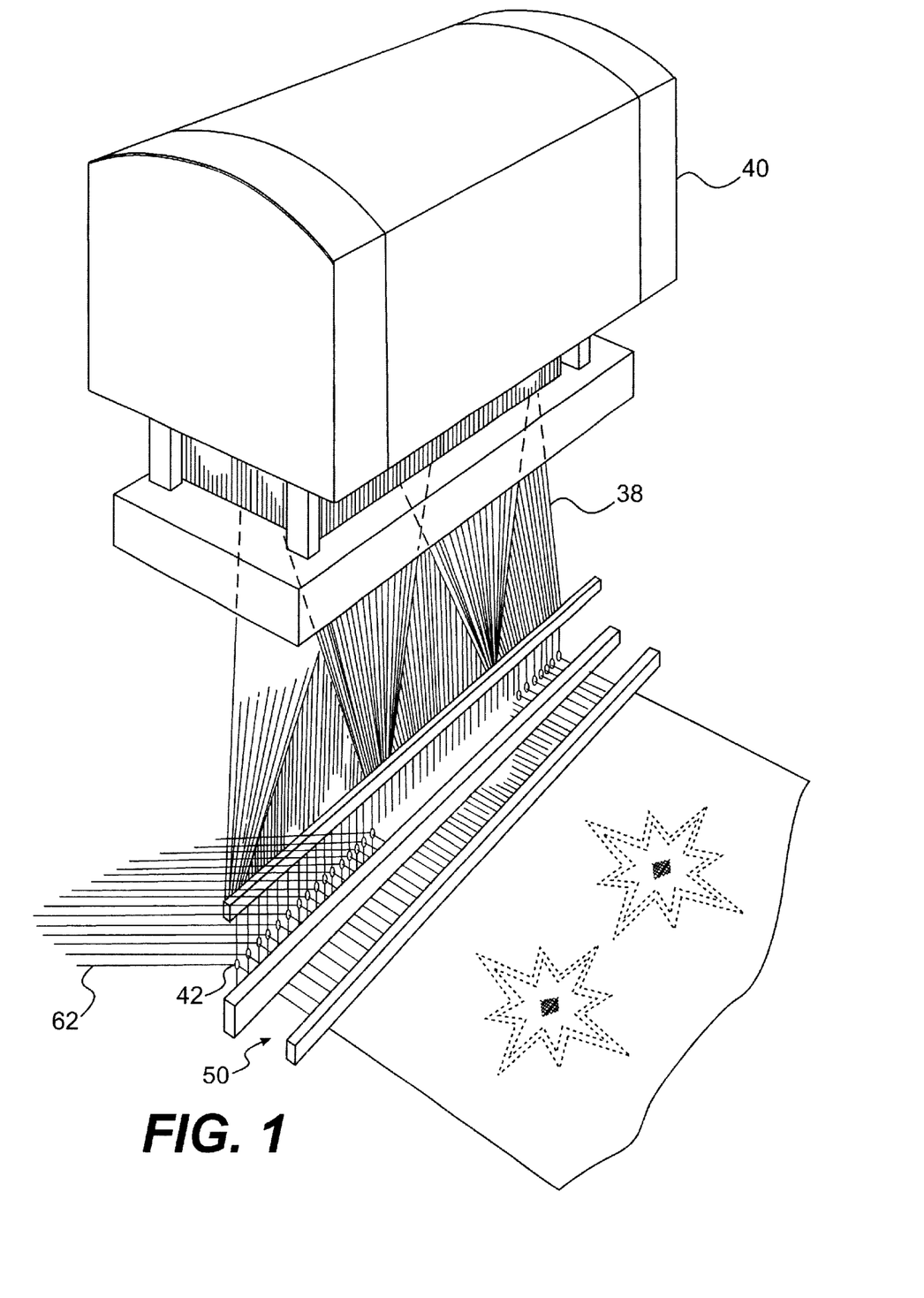
FIG. 1 is a perspective view of a portion of a Jacquard loom used to manufacture a fabric in accordance with an embodiment of the present invention.

Depending on the weave design, the Jacquard head raises and lowers heddle wires 38 and, therefore, warp yarns 46. This creates a shed through which the loom inserts the filling yarns. After each pick (the act of inserting the filling yarn through the shed), the Jacquard head 40 changes the position of predetermined heddles 48 to create a new shed as the reed 50 beats up the fabric. This repeated process creates a sometimes complex weave pattern.

Figure 5:
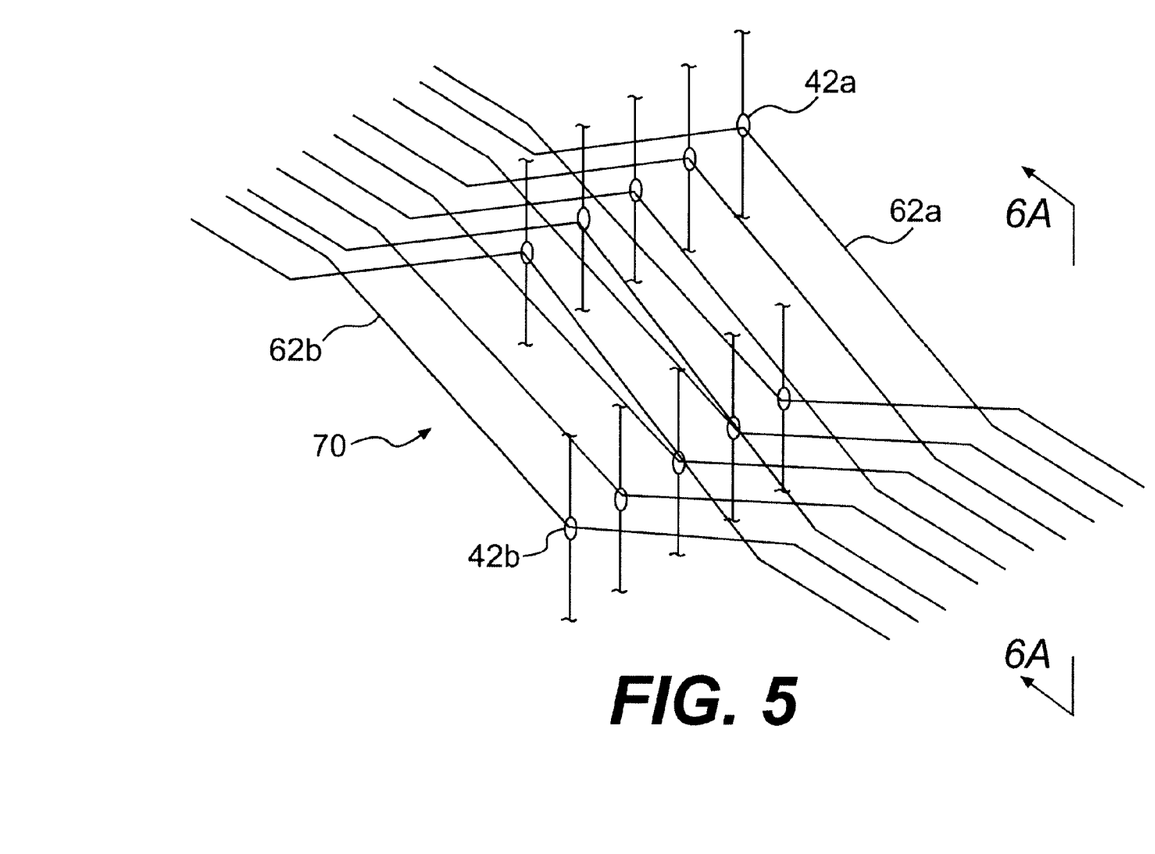
FIG. 5 is a partial view of an open shed of warp yarns to allow filling insertion to create a fabric in accordance with an embodiment of the present invention.

FIG. 5 illustrates a shed 70 created by (1) warp yarns 62a held in an up position by heddle eyes 42a and (2) warp yarns 62b held in a down position by heddle eyes 42b. After the filling yarn is inserted, the Jacquard head changes the position of designated heddles to thereby change the position of certain warp yarns and create a new shed. The loose weave areas are created by leaving the shed, with respect to a designated number of warp yarns, in an open position for a defined number of picks. In these areas, the warp and filling yarns do not interlock.

In one particular embodiment, the shed can be left in a configuration as shown in FIG. 5 in which warp yarns lay both above and below the filling yarns. In the resulting loose weave area, warp yarns 42a lie on top of the filling yarns, while warp yarns 42b lie beneath the filling yarns.

Figure 6A:
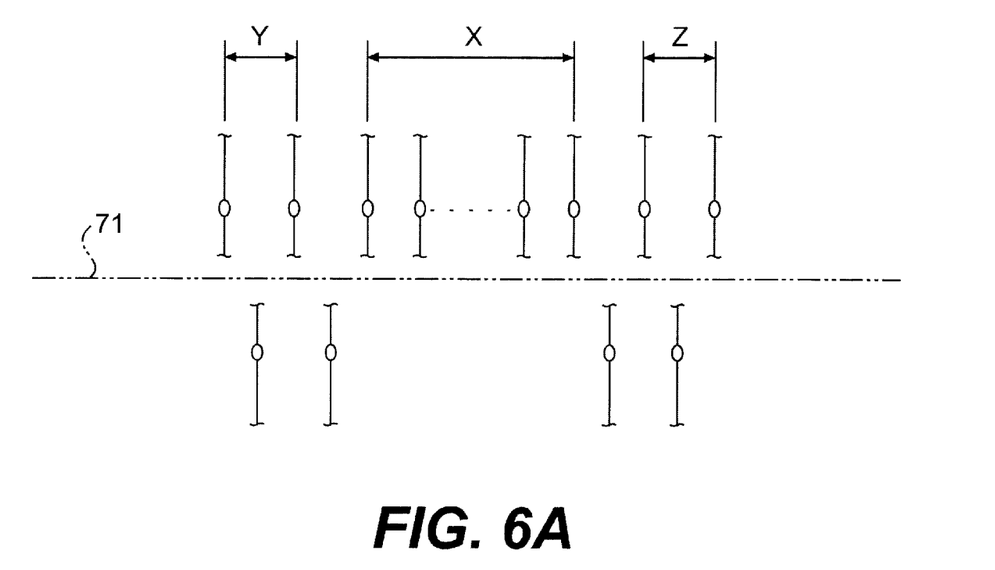
FIGS. 6A and 6B are frontal views of heddles in a shed position to allow filling insertion to create a fabric in accordance with an embodiment of the present invention.
Figure 6B:
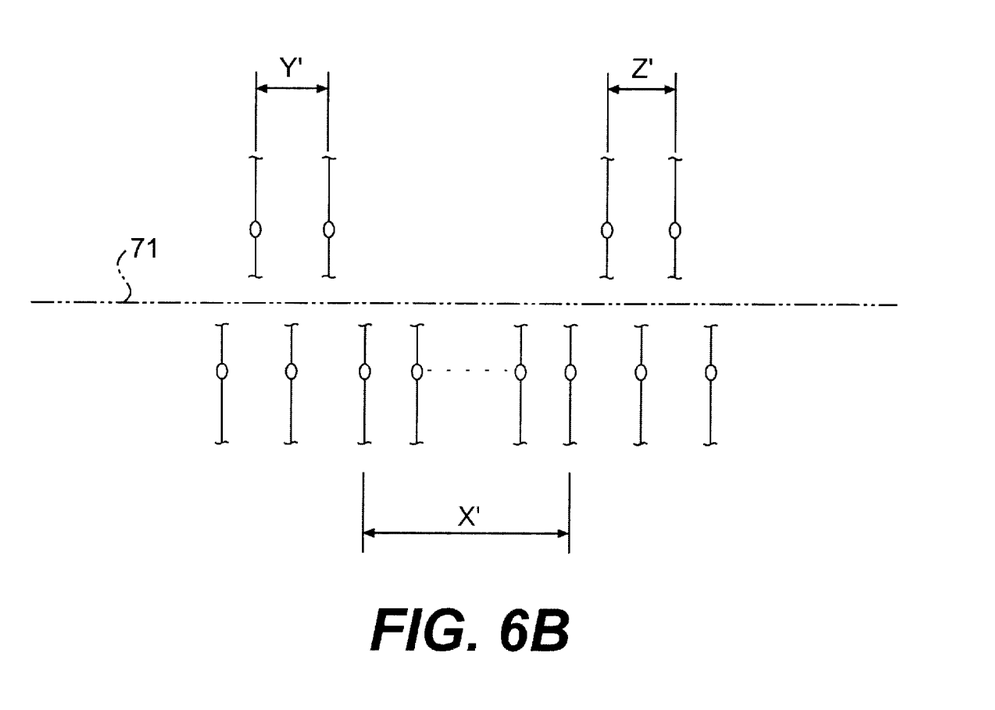

FIGS. 6A and 6B illustrate other suitable heddle positions for creating the loose weave area. In FIG. 6A, the heddles X are held above the fabric plane 71 for a designated number of picks, while heddles Y and Z change positions during those picks. This creates a loose weave area in which the warp yarns across the web's area defined by heddles X lie on top of the filling yarns. In FIG. 6B, the heddles X' are held below plane 71 for a designated number of picks, while the heddles Y' and Z' change positions. This creates a loose weave area in which the warp yarns across the web's area defined by heddles X' lie underneath the filling yarn.

Once the fabric is woven, a coating such as a fire-retardant may be applied to the web if desired or appropriate for the particular fabric. The coating may stiffen the warp and filling yarns, and the loose weave area's dimensions may therefore be increased accordingly to allow formation of the orifices to the proper size. The increase in dimensions compensates for the increased yarn stiffness.

At this point, the web may be spread out, and ornamental devices may be inserted through the loose weave areas described above.

While one or more preferred embodiments of the present invention have been described above, it should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the literal or equivalent scope of the appended claims.

What is claimed:

1. A decorative fabric for use in home furnishings, said decorative fabric comprising:
   a woven web having a back side and having a front side that defines an ornamental design, wherein said web defines a plurality of loose weave areas formed by non-interlocking warp yarns and filling yarns and located at predetermined positions within said design, and wherein said non-interlocking warp yarns and said filling yarns in each said area are separable from each other to form an orifice through said web; and
   a plurality of ornamental devices, wherein each of said ornamental devices is inserted through a respective said orifice and protrudes through said front side of said web.

2. A fabric as in claim 1, wherein said web is woven on a Jacquard loom.

3. A fabric as in claim 1, wherein said warp yarns in a said loose weave area lie on said front side of said web.

4. A fabric as in claim 1, wherein said filling yarns in a said loose weave area lie on said front side of said web.

5. A fabric as in claim 1, wherein each said loose weave area is configured so that said non-interlocking warp yarns and filling yarns secure said ornamental device in said web.

6. A fabric as in claim 1, wherein said ornamental devices include light emitting devices.

7. A fabric as in claim 6, including a power source secured to said web and a plurality of wires electrically connecting said power source to said light emitting devices.

8. A fabric as in claim 7, wherein said power source includes at least one battery and wherein said fabric includes a pocket attached to said web and in which said at least one battery is disposed.

9. A fabric as in claim 6, including a plurality of wires electrically connecting said light emitting devices to a plug configured to be operatively received by an AC electrical outlet.

10. A fabric as in claim 6, wherein each said light emitting device includes a back portion that abuts said back side of said web and an o-ring disposed about said light emitting device that abuts said front side of said web.

11. A fabric as in claim 10, wherein light emitting devices have a length of about 0.33 inches and diameter of about 0.2 inches.

12. A fabric as in claim 1, wherein each said loose weave area extends approximately 18 picks and 36 ends.

13. A fabric as in claim 1, wherein each said loose weave area is of a size ranging from 6 to 60 picks and from 6 to 60 ends.

14. A process for forming a decorative fabric for use in home furnishings, said method comprising the steps of:
   providing an ornamental fabric design;
   weaving a web according to said design, wherein said weaving step includes holding a defined number of warp yarns, at each of a plurality of predetermined positions in said design, in an open shed position for a defined number of picks, and wherein said number of warp yarns and said number of picks define a loose weave area of separable non-interlocking said warp yarns and filling yarns; and
   inserting ornamental devices through respective said loose weave areas.

15. A process as in claim 14, wherein said weaving step includes weaving said web on a Jacquard loom.

16. A process as in claim 14, wherein said weaving step includes holding said warp yarns in a top position of said shed for said defined number of picks.

17. A process as in claim 14, wherein said weaving step includes holding said warp yarns in a bottom position of said shed for said defined number of picks.

18. A process as in claim 14, wherein said ornamental devices are light emitting devices.

19. A process as in claim 18, wherein each said light emitting device is powered by a portable power source.

20. A process as in claim 19, including attaching a pocket to said web and securing said portable power source therein.

21. A process as in claim 18, wherein said inserting step includes applying an o-ring over said light emitting device that abuts a front side of said web.

* * * * *